(12) United States Patent
Ding et al.

(10) Patent No.: US 11,830,848 B2
(45) Date of Patent: Nov. 28, 2023

(54) ELECTRONIC DEVICE PACKAGE

(71) Applicant: Intel Corporation, Santa Clara, CA (US)

(72) Inventors: Zhicheng Ding, Shanghai (CN); Bin Liu, Shanghai (CN); Yong She, Songjiang (CN); Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 16/467,975

(22) PCT Filed: Dec. 31, 2016

(86) PCT No.: PCT/US2016/069644
§ 371 (c)(1),
(2) Date: Jun. 9, 2019

(87) PCT Pub. No.: WO2018/125254
PCT Pub. Date: Jul. 5, 2018

(65) Prior Publication Data
US 2021/0265305 A1  Aug. 26, 2021

(51) Int. Cl.
*H01L 25/065* (2023.01)
*H01L 21/56* (2006.01)
(Continued)

(52) U.S. Cl.
CPC ........ *H01L 25/0652* (2013.01); *H01L 21/568* (2013.01); *H01L 23/3128* (2013.01);
(Continued)

(58) Field of Classification Search
CPC .............. H01L 25/0652; H01L 21/568; H01L 23/3128; H01L 23/49811; H01L 23/5383;
(Continued)

(56) References Cited

U.S. PATENT DOCUMENTS 6,332,782 B1   12/2001   Bezama
6,459,039 B1   10/2002   Bezama
(Continued)

FOREIGN PATENT DOCUMENTS

CN   102148220   8/2011
JP   2001102479  4/2001
(Continued)

OTHER PUBLICATIONS

International Preliminary Report on Patentability for International Patent Application No. PCT/US2016/069644, dated Jul. 11, 2019, 14 pages.
(Continued)

*Primary Examiner* — Timor Karimy
(74) *Attorney, Agent, or Firm* — Schwabe, Williamson & Wyatt, P.C.

(57) ABSTRACT

Electronic device package technology is disclosed. An electronic device package in accordance with the present disclosure can include an electronic component, a redistribution layer, and an interposer electrically coupling the redistribution layer and the electronic component. The interposer can have interconnect interfaces on a top side electrically coupled to the electronic component and interconnect interfaces on a bottom side electrically coupled to the redistribution layer. A density of the interconnect interfaces on the top side can be greater than a density of the interconnect interfaces on the bottom side. Associated systems and methods are also disclosed.

15 Claims, 6 Drawing Sheets

(51) Int. Cl.
  *H01L 23/31* (2006.01)
  *H01L 23/498* (2006.01)
  *H01L 23/538* (2006.01)
  *H01L 25/00* (2006.01)

(52) U.S. Cl.
  CPC .... *H01L 23/49811* (2013.01); *H01L 23/5383* (2013.01); *H01L 25/0657* (2013.01); *H01L 25/50* (2013.01); *H01L 2225/0651* (2013.01); *H01L 2225/06506* (2013.01); *H01L 2225/06562* (2013.01)

(58) Field of Classification Search
  CPC ................ H01L 25/0657; H01L 25/50; H01L 2225/06506; H01L 2225/0651; H01L 2225/06562; H10B 80/00
  See application file for complete search history.

(56) References Cited

U.S. PATENT DOCUMENTS

| | | | |
|---|---|---|---|
| 6,661,088 B1 * | 12/2003 | Yoda | H01L 23/481 257/784 |
| 8,658,473 B2 | 2/2014 | McConnelee | |
| 2010/0279466 A1 | 11/2010 | Corisis | |
| 2011/0068459 A1 * | 3/2011 | Pagaila | H01L 24/81 257/E23.141 |
| 2011/0193235 A1 | 8/2011 | Hu | |
| 2011/0272805 A1 | 11/2011 | Ko | |
| 2013/0187284 A1 | 7/2013 | Pang | |
| 2013/0270691 A1 | 10/2013 | Mallik | |
| 2014/0138851 A1 | 5/2014 | Kim | |
| 2015/0108663 A1 | 4/2015 | Hong | |
| 2015/0115470 A1 | 4/2015 | Su | |
| 2015/0140736 A1 * | 5/2015 | Pendse | H01L 24/92 438/109 |
| 2018/0026022 A1 * | 1/2018 | Lee | H01L 25/0652 257/659 |
| 2018/0076178 A1 * | 3/2018 | Park | H01L 25/03 |

FOREIGN PATENT DOCUMENTS

| | | | |
|---|---|---|---|
| JP | 2015198093 | | 11/2015 |
| KR | 10-2012-0019263 | | 3/2012 |
| KR | 10-2016-0029621 | | 3/2016 |
| KR | 10-2016-0047424 | | 5/2016 |
| KR | 10-2016-0117476 | * | 9/2016 |
| KR | 10-2016-0129206 | * | 10/2016 |
| TW | 201349364 | | 12/2013 |

OTHER PUBLICATIONS

International Search Report dated Jul. 11, 2019, in International Application No. PCT/US2016/069644, filed Dec. 31, 2016; 6 pages.
Office Action for Chinese Patent Application No. 201680091259.9 dated Oct. 9, 2022, 20 pgs., with English translation.
Office Action for Chinese Patent Application No. 201680091259.9 dated May 12, 2023, 8 pgs.
Office Action for Chinese Patent Application No. 201680091259.9 dated May 30, 2023, 8 pgs.
Office Action for Korean Patent Application No. 10-2019-7015618 dated Aug. 21, 2023, 9 pgs.

* cited by examiner

ELECTRONIC DEVICE PACKAGE

PRIORITY INFORMATION

This application is a 371 U.S. national stage entry of PCT Application Serial No. PCT/US2016/069644, filed Dec. 31, 2016, which is incorporated herein by reference in its entirety.

TECHNICAL FIELD

Embodiments described herein relate generally to electronic device packages, and more particularly to interconnecting components in electronic device packages.

BACKGROUND

As mobile (e.g., cellular phones, tablets, etc.) and wearable markets demand more functions, storage, and performance, component density is increasing to provide space savings in these small form factor applications. For example, system in a package (SiP) for these applications often requires multi-stacked dies, as well as heterogeneous integrated circuits and component integration technology. High density interconnect (HDI) substrates are widely implemented in these SiP. Multi-stacked dies are typically electrically connected to the substrates with wirebond connections.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
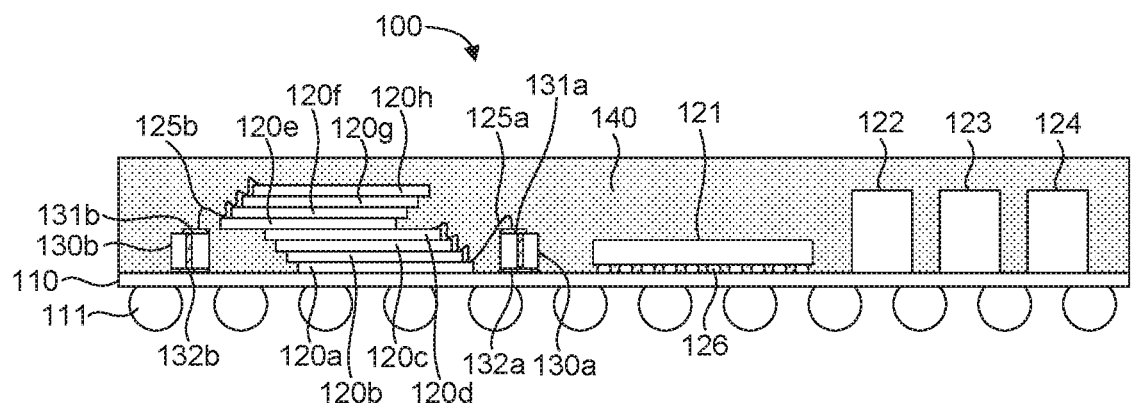
FIG. 1 illustrates a schematic cross-section of an electronic device package in accordance with an example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" items or objects are in physical contact and attached to one another. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Although HDI substrates are widely implemented in small form factor applications, these substrates add cost and Z-height compared to other alternatives. While redistribution layer (RDL) technology having multiple layers exists that provides much finer line pitch, width, and thickness compared to HDI substrates, multi-layered RDL is expensive and, due to the lack of mechanical strength in the structure, may not be able to withstand wirebond interconnect coupling with wirebond based integrated circuits, such as ASIC, DRAM, and NAND.

Accordingly, an electronic device package is disclosed that can accommodate wirebond interconnect coupling with substrate technology that can provide reduced Z-height at lower cost than HDI substrates and multi-layer RDL. In one example, an electronic device package in accordance with the present disclosure can comprise an electronic component, a redistribution layer, and an interposer electrically coupling the redistribution layer and the electronic component. The interposer can have interconnect interfaces on a top side electrically coupled to the electronic component and interconnect interfaces on a bottom side electrically coupled to the redistribution layer. A density of the interconnect interfaces on the top side can be greater than a density of the interconnect interfaces on the bottom side. Associated systems and methods are also disclosed.

Referring to FIG. 1, an exemplary electronic device package 100 is schematically illustrated in cross-section. The electronic device package 100 can include a redistribution layer 110. The electronic device package 100 can also include one or more electronic components electrically coupled to the redistribution layer 110. Electronic components are identified at 120*a-h* and 121-124. In addition, the electronic device package 100 can include one or more interposers 130*a*, 130*b* electrically coupling the redistribution layer 110 and at least some of the electronic components. For example, the interposer 130*a* can electrically couple the electronic components 120*a-d* to the redistribution layer 110, and the interposer 130*b* can electrically couple the electronic components 120*e-h* to the redistribution layer 110.

An electronic component can be any electronic device or component that may be included in an electronic device package, such as a semiconductor device (e.g., a die, a chip, a processor, computer memory, etc.). In one embodiment, some of the electronic components may represent a discrete chip, which may include an integrated circuit. The electronic components may be, include, or be a part of a processor, memory (e.g., ROM, RAM, EEPROM, flash memory, etc.), an application specific integrated circuit (ASIC), or a passive electrical component. In some embodiments, one or more of the electronic components can be a system-on-chip (SOC) or a package-on-package (POP). In some embodiments, the electronic device package 100 can be a system-in-a-package (SIP). It should be recognized that any suitable number of electronic components can be included.

The redistribution layer 110 may include any suitable material, such as typical semiconductor materials and/or dielectric materials. In one embodiment, the redistribution layer 110 may comprise an epoxy-based laminate structure. The redistribution layer 110 may include other suitable materials or configurations in other embodiments. For example, the redistribution layer 110 can be formed of any suitable semiconductor material (e.g., a silicon, gallium, indium, germanium, or variations or combinations thereof, among other substrates), one or more insulating materials, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in a redistribution layer.

In one aspect, the redistribution layer 110 can be configured to facilitate electrically coupling the electronic device package 100 with an external electronic component, such as a substrate (e.g., a circuit board such as a motherboard) to further route electrical signals and/or to provide power. The electronic device package 100 can include interconnects, such as solder balls 111, coupled to the redistribution layer 110 for electrically coupling the electronic device package 100 with an external electronic component.

The electronic components can be electrically coupled to the redistribution layer 110 according to a variety of suitable configurations including wire bonding, a flip chip configuration, and the like. One or more of the electronic components can be electrically coupled to the redistribution layer 110 using interconnect structures (e.g., the illustrated wirebonds 125a, 125b and/or solder balls 126) configured to route electrical signals between the electronic components and the redistribution layer 110. In some embodiments, the interconnect structures may be configured to route electrical signals such as, for example, I/O signals and/or power or ground signals associated with the operation of the electronic components.

The interposers 130a, 130b can facilitate electrically coupling at least some of the electronic components to the redistribution layer 110. For example, the interposer 130a can facilitate electrically coupling the electronic components 120a-d to the redistribution layer 110. The interconnect structures (e.g., the wirebond 125a) can be coupled to an interconnect interface 131a of the interposer 130a, which can be coupled to the redistribution layer 110 via an interconnect interface 132a. In addition, the interposer 130b can facilitate electrically coupling the electronic components 120e-h to the redistribution layer 110. The interconnect structures (e.g., the wirebond 125b) can be coupled to an interconnect interface 131b of the interposer 130b, which can be coupled to the redistribution layer 110 via an interconnect interface 132b.

The redistribution layer 110 may include electrical routing features configured to route electrical signals and/or power between any electronic component of the package 100 and an external electronic component via the solder balls 111. The electrical routing features may be internal and/or external to the redistribution layer 110. For example, in some embodiments, the redistribution layer 110 may include electrical routing features such as pads, vias, and/or traces (not shown) as commonly known in the art configured to receive the interconnect structures (e.g., wirebonds and solder balls) and interconnect interfaces 131a-b, 132a-b and route electrical signals to or from the electronic components. The pads, vias, and traces of the redistribution layer 110 can be constructed of the same or similar electrically conductive materials, or of different electrically conductive materials. In some embodiments, the redistribution layer 110 can have only a single layer, as opposed to multiple layers, which may be included in other embodiments.

In one aspect, the electronic components 120a-h can be in a stacked relationship, for example, to save space and enable smaller form factors. It should be recognized that any suitable number of electronic components can be included in a stack. At least some of the stacked electronic components can be wirebond based integrated circuits (e.g., ASIC, DRAM, and NAND). Such wirebond based integrated circuits can be electrically coupled to one another by wirebond connections. For example, the electronic components 120a-d can be electrically coupled to one another by the wirebond 125a, and the electronic components 120e-h can be electrically coupled to one another by the wirebond 125b. As described above, the wirebonds 125a, 125b can be coupled to the interposers 130a, 130b. Thus, each interposer can facilitate electrically coupling multiple electronic components to the redistribution layer 110.

A mold compound material 140 (e.g., an epoxy) can encapsulate one or more of the electronic components and the interposers 130a, 130b. For example, FIG. 1, shows the mold compound 140 encapsulating the electronic components and the interposers.

Figure 2A:
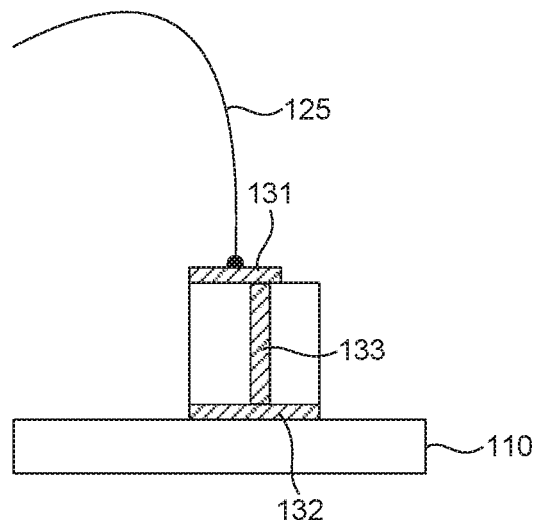
FIGS. 2A and 2B illustrate schematic cross-sections of an interposer of an electronic device package in accordance with an example embodiment.
Figure 2B:
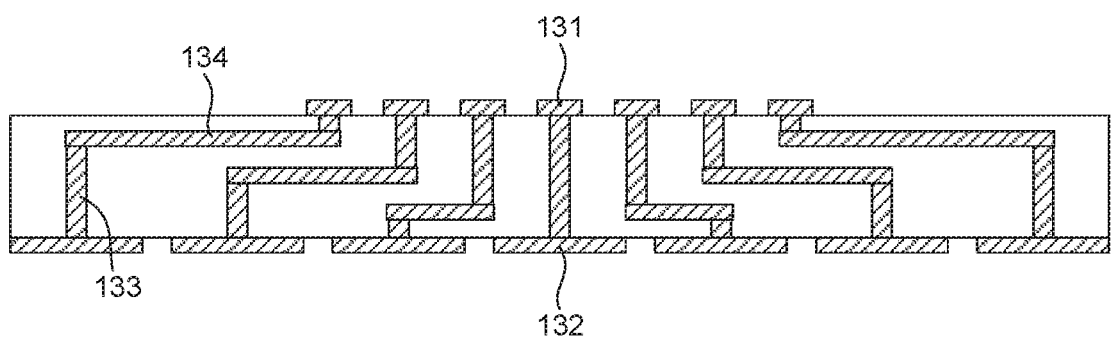

FIGS. 2A and 2B illustrate schematic cross-sectional views of a representative interposer 130. The interposer 130 can have interconnect interfaces 131 on a top side to electrically couple with an electronic component (e.g., via a wirebond 125). Accordingly, the interconnect interfaces 131 on the top side of the interposer 130 can comprise wirebond pads or landings or any other suitable structure that facilitates electrically coupling with a wirebond. In addition, the interposer 130 can have interconnect interfaces 132 on a bottom side to electrically couple with the redistribution layer 110. The interconnect interfaces 132 on the bottom side of the interposer 130 can comprise pads, contacts, pins, or any other suitable structure that facilitates electrically coupling with the redistribution layer 110 by any suitable process or technique, such as surface mounting technology (e.g., utilizing solder connections, solder balls, etc.).

The interposer 130 may include electrical routing features configured to route electrical signals and/or power between the interconnect interfaces 131 and the interconnect interfaces 132. The electrical routing features may be internal and/or external to the interposer 130. For example, in some embodiments, the interposer 130 may include electrical routing features such vias 133 and/or traces 134 as commonly known in the art configured to route electrical signals to or from the interconnect interfaces 131, 132. The interconnect interfaces 131, 132, vias 133, and traces 134 of the interposer 130 can be constructed of the same or similar electrically conductive materials, or of different electrically conductive materials.

Because wirebond connections may terminate in close proximity to one another, the size (e.g., diameter) of the interconnect interfaces 131 (e.g., wirebond pads) may be about 75-100 µm, and the spacing of the interconnect interfaces 131 (commonly defined by pad pitch) may be about 150-200 µm. On the other hand, the interconnect interfaces 132 can be larger in size (e.g., diameter) and pitch than that of the interconnect interface 131. The relatively large size and pitch of the interconnect interfaces 132 can benefit routing in the redistribution layer 110, which can be configured to couple with the interconnect interfaces 132. In one aspect, the density of the interconnect interfaces 131, 132 can be defined by the pitch of the interconnect interfaces. Thus, a density of the interconnect interfaces 131 on the top side of the interposer 130 can be greater than a density of the interconnect interfaces 132 on the bottom side of the interposer 130. As shown in FIG. 2B, the electrical routing features (e.g., the vias 133 and traces 134) can "fan out" from the relatively fine pitch of the interconnect interfaces 131 to the larger pitch of the interconnect interfaces 132. Such fan out of the electrical routing features can be accomplished in any suitable manner. The configuration shown in FIG. 2B is provided as an example.

The interposer 130 may include any suitable material, such as typical semiconductor materials and/or dielectric materials. In one embodiment, the interposer 130 may comprise an epoxy-based laminate structure. The interposer 130 may include other suitable materials or configurations in other embodiments. For example, the interposer 130 can be formed of any suitable semiconductor material (e.g., a silicon, gallium, indium, germanium, or variations or combinations thereof, among other substrates), one or more insulating materials, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in the interposer 130.

Figure 3A:
FIGS. 3A-3G illustrate aspects of a method for making an electronic device package in accordance with an example embodiment.
Figure 3B:
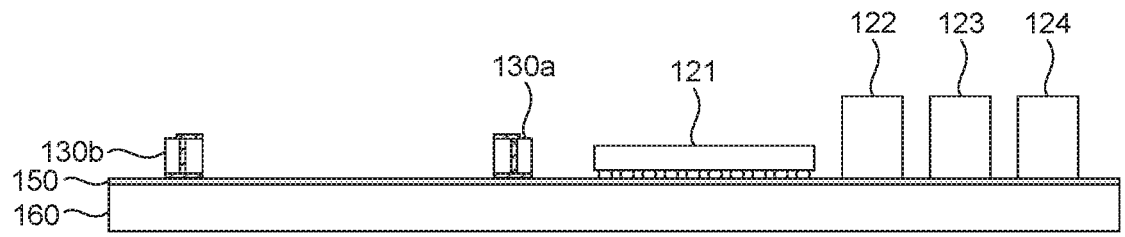

FIGS. 3A-3G schematically illustrate aspects of exemplary methods or processes for making an electronic device package, such as the electronic device package 100. FIG. 3A illustrates a side cross-sectional view of an adhesive layer 150 disposed on a temporary carrier 160, such as a wafer. As shown in FIG. 3B, interposers 130a, 130b can be disposed on the temporary carrier 160 such that bottom sides of the interposers are in contact with the adhesive layer. In addition, various electronic components 121-124 (e.g., ASIC and/or passive components) can also be disposed on the temporary carrier 160 in contact with the adhesive layer 150. Thus, the interposers 130a, 130b and the electronic components 121-124 can be supported by the temporary carrier 160.

Figure 3C:
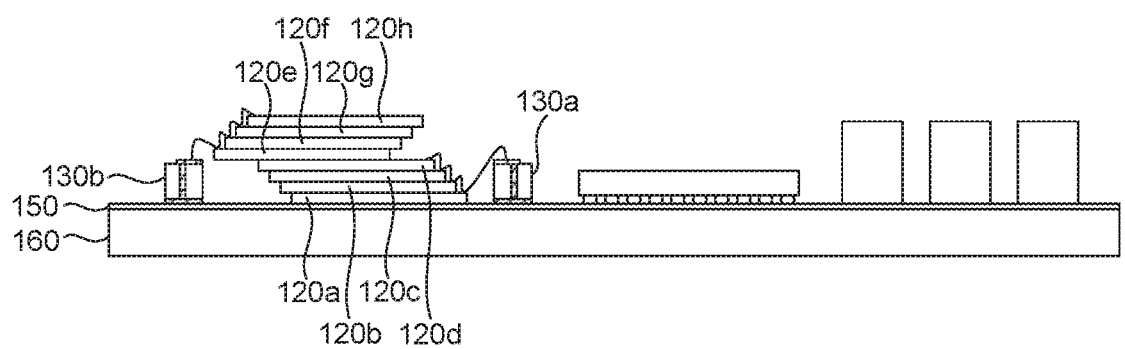

As shown in FIG. 3C, electronic components 120a-h (e.g., various integrated circuits) can be disposed on the temporary carrier 160 in contact with the adhesive layer 150. The electronic components 120a-h can be in a stacked arrangement. The electronic components 120a-d can be electrically coupled to one another by wire bond connections, and the electronic components 120e-h can be electrically coupled to one another by wire bond connections. In addition, the electronic components 120a-d can be electrically coupled to the interposer 130a by wire bond connections, and the electronic components 120e-h can be electrically coupled to the interposer 130b by wire bond connections.

Figure 3D:
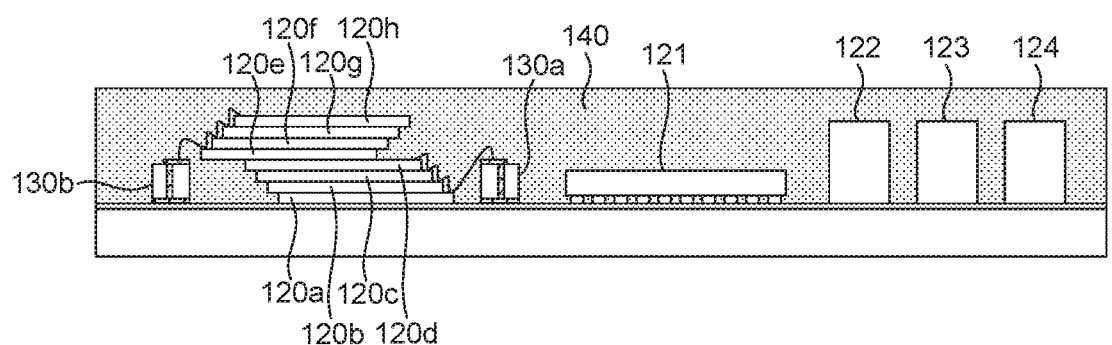
Figure 3E:
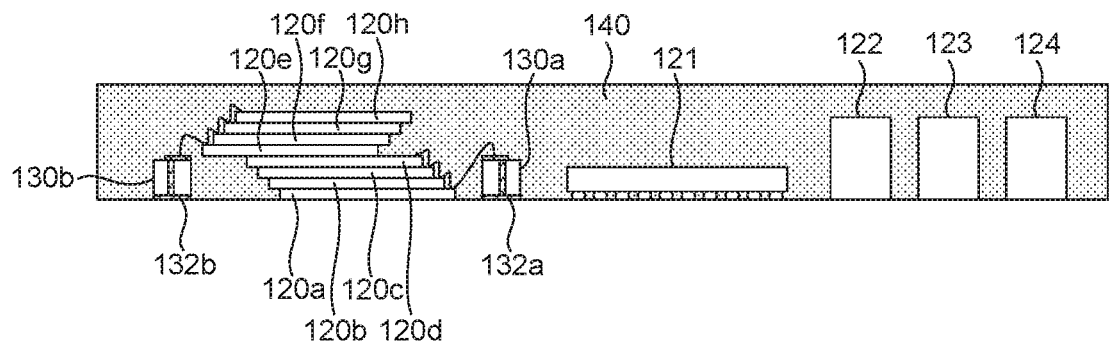
Figure 3F:
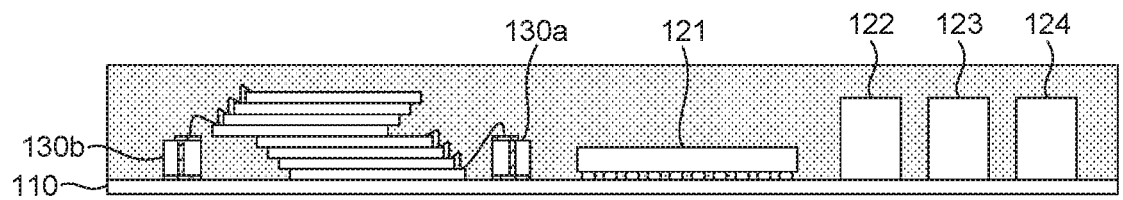
Figure 3G:
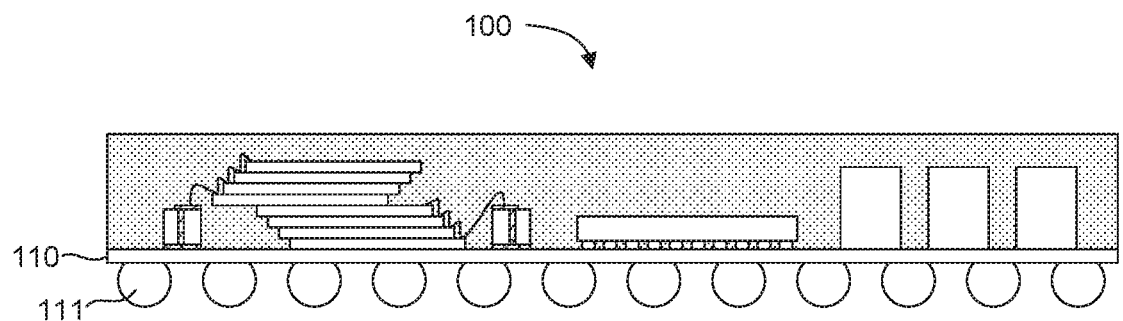

The electronic components 120a-h and 121-124 and the interposers 130a, 130b can then be encapsulated with a mold compound 140, as shown in FIG. 3D. Following this, as shown in FIG. 3E, the temporary carrier and the adhesive layer can be removed from a bottom of the mold compound 140 and the interposers 130a, 130b. This can expose the interconnect interfaces 132a, 132b on the bottoms of the interposers 130a, 130b, as well as the interconnect structures of the electronic components 121-124. As shown in FIG. 3F, the redistribution layer 110 can be disposed on the bottom of the mold compound 140, the interposers 130a, 130b, and the electronic components 121-124. The interposers 130a, 130b, and the electronic components 121-124 can be electrically coupled to the redistribution layer 110. In some embodiments, the redistribution layer 110 can be formed in this position. Solder balls 111 can be disposed on or attached to a bottom of the redistribution layer 110, as shown in FIG. 3G, to arrive at the completed electronic device package 100. The method illustrated in FIGS. 3A-3G shows an approach to making the electronic device package 100 where the redistribution layer 110 is formed or assembled "last" or, in other words, after assembly of the electronic components and interposers.

In one aspect, FIGS. 3B-3D illustrate embodiments of electronic device package precursors, which each include the interposers 130a, 130b supported by the temporary carrier 160. Each of these electronic device package precursors can be subjected to further processing as described above to create an electronic device package in accordance with the present disclosure.

Figure 4A:
FIGS. 4A-4F illustrate aspects of a method for making an electronic device package in accordance with another example embodiment.
Figure 4B:
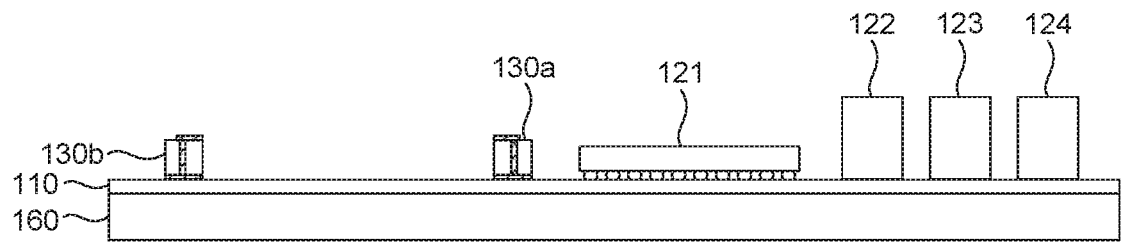

FIGS. 4A-4F schematically illustrate aspects of exemplary methods or processes for making an electronic device package, such as the electronic device package 100. FIG. 4A illustrates a side cross-sectional view of the redistribution layer 110 disposed on the temporary carrier 160. In some embodiments, the redistribution layer 110 can be formed in this position. As shown in FIG. 4B, interposers 130a, 130b can be disposed on the redistribution layer 110. In addition, various electronic components 121-124 (e.g., ASIC and/or passive components) can also be disposed on the redistribution layer 110. Thus, the interposers 130a, 130b and the electronic components 121-124 can be supported by the temporary carrier 160. The interposers 130a, 130b, and the electronic components 121-124 can be electrically coupled to the redistribution layer 110. Surface mounting technology can be utilized to place and electrically couple the electronic components 121-124 and the interposers 130a, 130b to the redistribution layer 110.

Figure 4C:
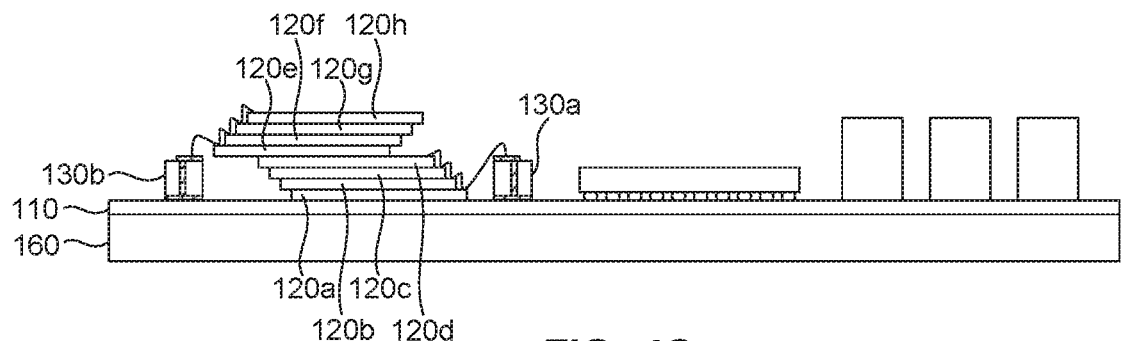

As shown in FIG. 4C, electronic components 120a-h (e.g., various integrated circuits) can be disposed on the redistribution layer 110. The electronic components 120a-h can be in a stacked arrangement. Die attach film (not shown) can be used to maintain the electronic components 120a-h in a stack during assembly. The electronic components 120a-d can be electrically coupled to one another by wire bond connections, and the electronic components 120e-h can be electrically coupled to one another by wire bond connections. In addition, the electronic components 120a-d can be electrically coupled to the interposer 130a by wire bond connections, and the electronic components 120e-h can be electrically coupled to the interposer 130b by wire bond connections. Because the redistribution layer 110 may be relatively thin and lacking mechanical strength, the presence of the interposers 130a, 130b may provide mechanical benefits during manufacture by having the mechanical strength to withstand many (i.e., thousands) of wirebond landings instead the redistribution layer 110 being subjected to these stresses. The interposers as disclosed herein can therefore provide electrical and mechanical benefits to the package.

Figure 4D:
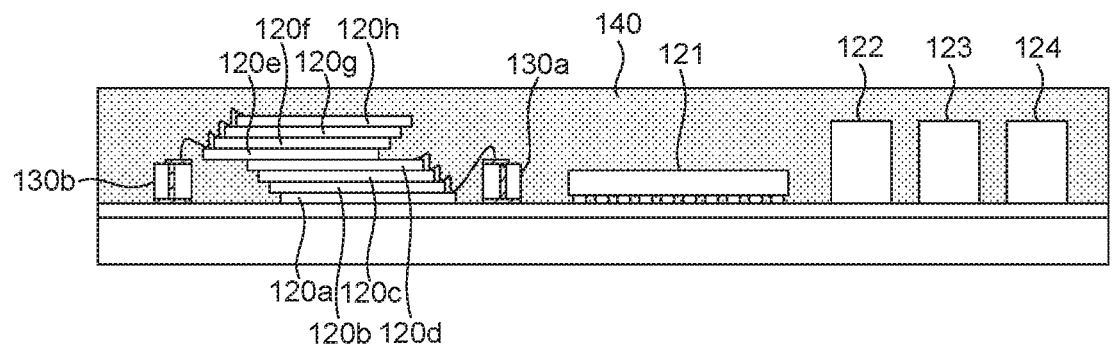
Figure 4E:
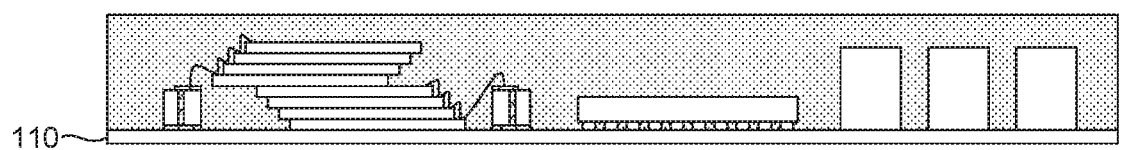
Figure 4F:
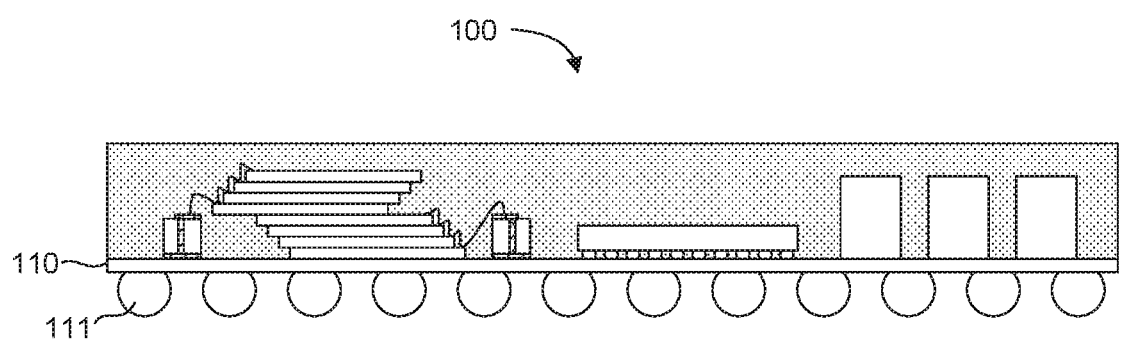

The electronic components 120a-h and 121-124 and the interposers 130a, 130b can then be encapsulated with a mold compound 140, as shown in FIG. 4D. As shown in FIG. 4E, the temporary carrier can be removed from a bottom of the redistribution layer 110. Solder balls 111 can then be disposed on or attached to the bottom of the redistribution layer 110, as shown in FIG. 4F, to arrive at the completed electronic device package 100. The method illustrated in FIGS. 4A-4F shows an approach to making the electronic device package 100 where the redistribution layer 110 is formed or assembled "first" or, in other words, prior to assembly of the electronic components and interposers.

In one aspect, FIGS. 4B-4D illustrate embodiments of electronic device package precursors, which each include the interposers 130a, 130b supported by the temporary carrier 160. In this case, the interposers 130a, 130b are also coupled to the redistribution layer 110. Each of these electronic device package precursors can be subjected to further processing as described above to create an electronic device package in accordance with the present disclosure.

Figure 5:
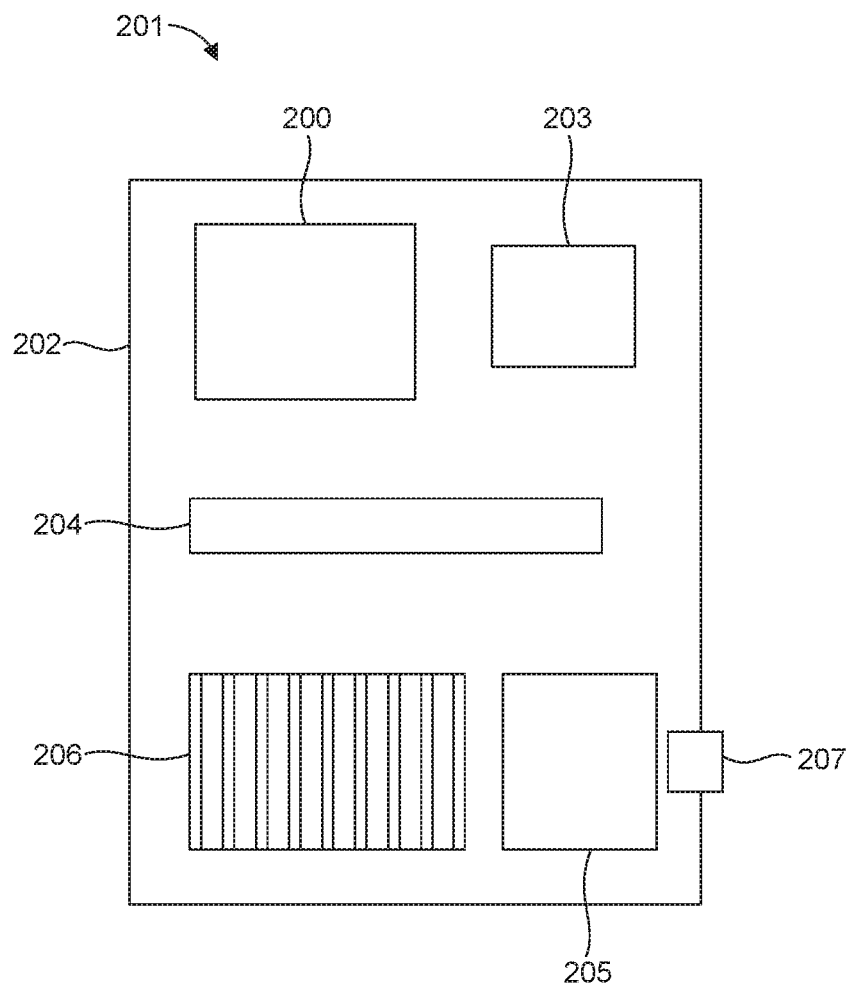
FIG. 5 is a schematic illustration of an exemplary computing system.

FIG. 5 schematically illustrates an example computing system 201. The computing system 201 can include an electronic device package 200 as disclosed herein, coupled to a motherboard 202. In one aspect, the computing system 201 can also include a processor 203, a memory device 204, a radio 205, a cooling system (e.g., a heat sink and/or a heat spreader) 206, a port 207, a slot, or any other suitable device or component, which can be operably coupled to the motherboard 270. The computing system 201 can comprise any type of computing system, such as a desktop computer, a laptop computer, a tablet computer, a smartphone, a server, a wearable electronic device, etc. Other embodiments need not include all of the features specified in FIG. 5, and may include alternative features not specified in FIG. 5.

EXAMPLES

The following examples pertain to further embodiments.

In one example there is provided, an electronic device package comprising an electronic component, a redistribution layer, and an interposer electrically coupling the redistribution layer and the electronic component, the interposer having interconnect interfaces on a top side electrically coupled to the electronic component and interconnect interfaces on a bottom side electrically coupled to the redistribution layer, wherein a density of the interconnect interfaces on the top side is greater than a density of the interconnect interfaces on the bottom side.

In one example of an electronic device package, the interconnect interfaces on the top side of the interposer comprise wire bond landings.

In one example of an electronic device package, the interposer and the electronic component are electrically coupled by a wire bond connection.

In one example of an electronic device package, the interconnect interfaces on the bottom side of the interposer comprise pads.

In one example, an electronic device package comprises a mold compound encapsulating the electronic component and the interposer.

In one example of an electronic device package, the mold compound comprises an epoxy.

In one example of an electronic device package, the redistribution layer comprises a single layer.

In one example of an electronic device package, the electronic component comprises a plurality of electronic components in a stacked arrangement.

In one example of an electronic device package, at least some of the plurality of electronic components are electrically coupled to one another by wire bond connections.

In one example, an electronic device package comprises a second electronic component, and a second interposer electrically coupling the redistribution layer and the second electronic component.

In one example of an electronic device package, the second electronic component comprises a plurality of second electronic components in a stacked arrangement.

In one example of an electronic device package, at least some of the plurality of second electronic components are electrically coupled to one another by wire bond connections.

In one example, an electronic device package comprises interconnect structures coupled to a bottom side of the redistribution layer to facilitate electrically coupling the electronic device package with an external electronic component.

In one example of an electronic device package, the interconnect structures comprise solder balls.

In one example of an electronic device package, the electronic component comprises an integrated circuit.

In one example of an electronic device package, the integrated circuit comprises an application specific integrated circuit, computer memory, or a combination thereof.

In one example of an electronic device package, the density of the interconnect interfaces is defined by a pitch of the interconnect interfaces.

In one example there is provided, an electronic device package precursor comprising a temporary carrier, and an interposer supported by the temporary carrier, the interposer having interconnect interfaces on a top side to electrically couple to an electronic component and interconnect interfaces on a bottom side to electrically couple to a redistribution layer, wherein a density of the interconnect interfaces on the top side is greater than a density of the interconnect interfaces on the bottom side.

In one example, an electronic device package precursor comprises an adhesive layer disposed on the temporary carrier and in contact with the bottom side of the interposer.

In one example, an electronic device package precursor comprises an electronic component supported by the temporary carrier and in contact with the adhesive layer.

In one example of an electronic device package precursor, the electronic component is electrically coupled to the interposer.

In one example of an electronic device package precursor, the interconnect interfaces on the top side of the interposer comprise wire bond landings.

In one example of an electronic device package precursor, the interposer and the electronic component are electrically coupled by a wire bond connection.

In one example, an electronic device package precursor comprises a mold compound encapsulating the electronic component and the interposer.

In one example of an electronic device package precursor, the mold compound comprises an epoxy.

In one example of an electronic device package precursor, the electronic component comprises a plurality of electronic components in a stacked arrangement.

In one example of an electronic device package precursor, at least some of the plurality of electronic components are electrically coupled to one another by wire bond connections.

In one example, an electronic device package precursor comprises a second electronic component supported by the temporary carrier, and a second interposer supported by the temporary carrier and in contact with the adhesive layer, the second interposer being electrically coupled to the second electronic component.

In one example of an electronic device package precursor, the second electronic component comprises a plurality of second electronic components in a stacked arrangement.

In one example of an electronic device package precursor, at least some of the plurality of second electronic components are electrically coupled to one another by wire bond connections.

In one example of an electronic device package precursor, the electronic component comprises an integrated circuit.

In one example of an electronic device package precursor, the integrated circuit comprises an application specific integrated circuit, computer memory, or a combination thereof.

In one example, an electronic device package precursor comprises a redistribution layer supported by the temporary carrier and electrically coupled to the interposer.

In one example, an electronic device package precursor comprises an electronic component supported by the temporary carrier.

In one example of an electronic device package precursor, the electronic component is electrically coupled to the interposer.

In one example of an electronic device package precursor, the interconnect interfaces on the top side of the interposer comprise wire bond landings.

In one example of an electronic device package precursor, the interposer and the electronic component are electrically coupled by a wire bond connection.

In one example, an electronic device package precursor comprises a mold compound encapsulating the electronic component and the interposer.

In one example of an electronic device package precursor, the mold compound comprises an epoxy.

In one example of an electronic device package precursor, the redistribution layer comprises a single layer.

In one example of an electronic device package precursor, the electronic component comprises a plurality of electronic components in a stacked arrangement.

In one example of an electronic device package precursor, at least some of the plurality of electronic components are electrically coupled to one another by wire bond connections.

In one example, an electronic device package precursor comprises a second electronic component supported by the temporary carrier, and a second interposer supported by the temporary carrier, the second interposer electrically coupled to the redistribution layer and the second electronic component.

In one example of an electronic device package precursor, the second electronic component comprises a plurality of second electronic components in a stacked arrangement.

In one example of an electronic device package precursor, at least some of the plurality of second electronic components are electrically coupled to one another by wire bond connections.

In one example of an electronic device package precursor, the electronic component comprises an integrated circuit.

In one example of an electronic device package precursor, the integrated circuit comprises an application specific integrated circuit, computer memory, or a combination thereof.

In one example of an electronic device package precursor, the interconnect interfaces on the bottom side of the interposer comprise pads.

In one example of an electronic device package precursor, the density of the interconnect interfaces is defined by a pitch of the interconnect interfaces.

In one example, there is provided a computing system comprising a motherboard, and an electronic device package operably coupled to the motherboard. The electronic device package comprises an electronic component, a redistribution layer, and an interposer electrically coupling the redistribution layer and the electronic component, the interposer having interconnect interfaces on a top side electrically coupled to the electronic component and interconnect interfaces on a bottom side electrically coupled to the redistribution layer, wherein a density of the interconnect interfaces on the top side is greater than a density of the interconnect interfaces on the bottom side.

In one example of a computing system, the computing system comprises a desktop computer, a laptop, a tablet, a smartphone, a server, a wearable electronic device, or a combination thereof.

In one example of a computing system, the computing system further comprises a processor, a memory device, a cooling system, a radio, a slot, a port, or a combination thereof operably coupled to the motherboard.

In one example there is provided a method for making an electronic device package comprising obtaining an interposer having interconnect interfaces on a top side to electrically couple to an electronic component and interconnect interfaces on a bottom side to electrically couple to a redistribution layer, wherein a density of the interconnect interfaces on the top side is greater than a density of the interconnect interfaces on the bottom side, and supporting the interposer with a temporary carrier.

In one example, a method for making an electronic device package comprises disposing an adhesive layer on the temporary carrier, and disposing the interposer on the adhesive layer such that the bottom side of the interposer is in contact with the adhesive layer.

In one example, a method for making an electronic device package comprises disposing an electronic component on the temporary carrier in contact with the adhesive layer.

In one example, a method for making an electronic device package comprises electrically coupling the electronic component and the interposer.

In one example of a method for making an electronic device package, the interconnect interfaces on the top side of the interposer comprise wire bond landings.

In one example of a method for making an electronic device package, the interposer and the electronic component are electrically coupled by a wire bond connection.

In one example, a method for making an electronic device package comprises encapsulating the electronic component and the interposer with a mold compound.

In one example of a method for making an electronic device package, the mold compound comprises an epoxy.

In one example, a method for making an electronic device package comprises removing the temporary carrier and the adhesive layer from a bottom of the mold compound and the interposer.

In one example, a method for making an electronic device package comprises disposing a redistribution layer on the bottom of the mold compound and the interposer, and electrically coupling the redistribution layer and the interposer.

In one example, a method for making an electronic device package comprises disposing solder balls on a bottom of the redistribution layer.

In one example of a method for making an electronic device package, the electronic component comprises a plurality of electronic components, and further comprising disposing the plurality of electronic components in a stacked arrangement.

In one example, a method for making an electronic device package comprises electrically coupling at least some of the plurality of electronic components to one another by wire bond connections.

In one example, a method for making an electronic device package comprises supporting a second electronic component with the temporary carrier, disposing a second interposer on the temporary carrier in contact with the adhesive layer, and electrically coupling the second interposer and the second electronic component.

In one example of a method for making an electronic device package, the second electronic component comprises a plurality of second electronic components, and further comprising disposing the plurality of second electronic components in a stacked arrangement.

In one example, a method for making an electronic device package comprises electrically coupling at least some of the plurality of second electronic components to one another by wire bond connections.

In one example of a method for making an electronic device package, the electronic component comprises an integrated circuit.

In one example of a method for making an electronic device package, the integrated circuit comprises an application specific integrated circuit, computer memory, or a combination thereof.

In one example, a method for making an electronic device package comprises disposing a redistribution layer on the temporary carrier, and electrically coupling the redistribution layer and the interposer.

In one example, a method for making an electronic device package comprises disposing an electronic component on the temporary carrier.

In one example, a method for making an electronic device package comprises electrically coupling the electronic component and the interposer.

In one example of a method for making an electronic device package, the interconnect interfaces on the top side of the interposer comprise wire bond landings.

In one example of a method for making an electronic device package, the interposer and the electronic component are electrically coupled by a wire bond connection.

In one example, a method for making an electronic device package comprises encapsulating the electronic component and the interposer with a mold compound.

In one example of a method for making an electronic device package, the mold compound comprises an epoxy.

In one example, a method for making an electronic device package comprises removing the temporary carrier from a bottom of the redistribution layer.

In one example, a method for making an electronic device package comprises disposing solder balls on a bottom of the redistribution layer.

In one example of a method for making an electronic device package, the redistribution layer comprises a single layer.

In one example of a method for making an electronic device package, the electronic component comprises a plurality of electronic components, and further comprising disposing the plurality of electronic components in a stacked arrangement In one example, a method for making an electronic device package comprises electrically coupling at least some of the plurality of electronic components to one another by wire bond connections.

In one example, a method for making an electronic device package comprises supporting a second electronic component with the temporary carrier, disposing a second interposer on the redistribution layer, and electrically coupling the second interposer to the redistribution layer and the second electronic component.

In one example of a method for making an electronic device package, the second electronic component comprises a plurality of second electronic components, and further comprising disposing the plurality of second electronic components in a stacked arrangement.

In one example, a method for making an electronic device package comprises electrically coupling at least some of the plurality of second electronic components to one another by wire bond connections.

In one example of a method for making an electronic device package, the electronic component comprises an integrated circuit.

In one example of a method for making an electronic device package, the integrated circuit comprises an application specific integrated circuit, computer memory, or a combination thereof.

In one example of a method for making an electronic device package, the interconnect interfaces on the bottom side of the interposer comprise pads.

In one example of a method for making an electronic device package, the density of the interconnect interfaces is defined by a pitch of the interconnect interfaces.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
   an electronic component;
   a redistribution layer;
   an interposer on the redistribution layer and laterally spaced apart from the electronic component, the interposer electrically coupling the redistribution layer and the electronic component, the interposer having interconnect interfaces on a top side electrically coupled to the electronic component and interconnect interfaces on a bottom side electrically coupled to the redistribution layer, and the interposer having a first outermost sidewall and a second outermost sidewall between the top side and the bottom side, the second outermost sidewall laterally opposite the first outermost sidewall, wherein a density of the interconnect interfaces on the top side is greater than a density of the interconnect interfaces on the bottom side, and wherein the redistribution layer extends laterally beyond the first outermost sidewall and the second outermost sidewall of the interposer; and
   a mold compound encapsulating the electronic component and the interposer, the mold compound on the redistribution layer.

2. The electronic device package of claim 1, wherein the interconnect interfaces on the top side of the interposer comprise wire bond landings.

3. The electronic device package of claim 2, wherein the interposer and the electronic component are electrically coupled by a wire bond connection.

4. The electronic device package of claim 1, wherein the interconnect interfaces on the bottom side of the interposer comprise pads.

5. The electronic device package of claim 1, wherein the mold compound comprises an epoxy.

6. The electronic device package of claim 1, wherein the redistribution layer comprises a single layer.

7. The electronic device package of claim 1, wherein the electronic component comprises a plurality of electronic components in a stacked arrangement.

8. The electronic device package of claim 7, wherein at least some of the plurality of electronic components are electrically coupled to one another by wire bond connections.

9. The electronic device package of claim 1, further comprising a second electronic component, and a second interposer electrically coupling the redistribution layer and the second electronic component.

10. The electronic device package of claim 9, wherein the second electronic component comprises a plurality of second electronic components in a stacked arrangement.

11. The electronic device package of claim 10, wherein at least some of the plurality of second electronic components are electrically coupled to one another by wire bond connections.

12. The electronic device package of claim 1, further comprising interconnect structures coupled to a bottom side of the redistribution layer to facilitate electrically coupling the electronic device package with an external electronic component.

13. The electronic device package of claim 12, wherein the interconnect structures comprise solder balls.

14. The electronic device package of claim 1, wherein the electronic component comprises an integrated circuit.

15. The electronic device package of claim 14, wherein the integrated circuit comprises an application specific integrated circuit, computer memory, or a combination thereof.

* * * * *